United States Patent [19]
Nishikawa

[11] Patent Number: 5,777,703
[45] Date of Patent: Jul. 7, 1998

[54] ACTIVE MATRIX TYPE LIQUID CRYSTAL DISPLAY APPARATUS WITH A PROJECTION PART IN THE DRAIN LINE

[75] Inventor: Ryuji Nishikawa, Hashima-Gun, Japan

[73] Assignee: Sanyo Electric Co., Ltd., Osaka, Japan

[21] Appl. No.: 519,961

[22] Filed: Aug. 28, 1995

[30] Foreign Application Priority Data

Sep. 30, 1994 [JP] Japan .................................. 6-237484
Sep. 30, 1994 [JP] Japan .................................. 6-237485

[51] Int. Cl.$^6$ .................................................. G02F 1/136
[52] U.S. Cl. .................................. 349/47; 349/43; 349/46
[58] Field of Search .................................. 349/43, 46, 47

[56] References Cited

U.S. PATENT DOCUMENTS

| 4,563,806 | 1/1986 | Coissard et al. | 29/571 |
| 4,783,147 | 11/1988 | Maurice et al. | 349/43 |
| 5,003,356 | 3/1991 | Wakai et al. | 349/43 |
| 5,055,899 | 10/1991 | Wakai et al. | 349/43 |
| 5,508,591 | 4/1996 | Kanemori et al. | 349/43 |

FOREIGN PATENT DOCUMENTS 59-232385  12/1984  Japan .
61-261774  11/1986  Japan .

*Primary Examiner*—Anita Pellman Gross
*Attorney, Agent, or Firm*—Loeb & Loeb LLP

[57] ABSTRACT

In an active matrix type liquid crystal display apparatus, a thin film transistor of staggered type is formed in the vicinity of the intersection of the gate line and the drain line. Moreover, in the above mentioned vicinity of the intersection of the drain line, a projection part extending in the longitudinal direction of the gate line is provided. This projection part functions essentially as the drain electrode. The confronting region, where the source electrode, the drain electrode and the projection part confront each other, is covered by the gate electrode constituting a part of the gate line. By providing the projection part in the drain line, and hence also forming the channel region in the confronting region of the source electrode and the projection part, this channel region becomes an isolated composition within the thin film transistor. Therefore, a parasitic channel is prevented from forming between the source electrode of the pixel on one side, and the drain electrode of another pixel on the other side, and this parasitic channel is prevented from conducting electricity.

19 Claims, 4 Drawing Sheets

ACTIVE MATRIX TYPE LIQUID CRYSTAL DISPLAY APPARATUS WITH A PROJECTION PART IN THE DRAIN LINE

BACKGROUND OF THE INVENTION

1. Field of the Invention

This invention relates to a liquid crystal display apparatus, and more particularly to a liquid crystal display apparatus comprising a thin film transistor (TFT) disposed in each pixel as a switching element to control the charge of each pixel capacitor.

2. Description of the Prior Art

The liquid crystal display apparatus is characterized by being small-sized, light-weight, and having low power consumption, and is put into practical use in such fields as in OA equipment and in AV equipment. In particular, the active matrix type which uses the TFT for the switching element, can, in principle, perform the static drive of 100% duty ratio in a multiplexed manner, and is used in large screen, high resolution, animation displays.

The active matrix type liquid crystal display consists a substrate on which a plurality of pixel electrodes and a TFT connected to each pixel electrode are composed, each pixel electrode constituting one end of each liquid crystal driving capacitor, and a substrate on which a common electrode constituting the other end of the liquid crystal driving capacitors is composed. The two substrates confront each other and have the liquid crystal interposed between them. Each TFT is selected for each gateline and turned ON, and it then selects the input signal voltage from the drain line to charge the pixel electrode. During non-selection, due to the OFF resistance of the TFT, the charging voltage for the pixel electrode is held for one field period.

A staggered type TFT in which the gate is disposed on the upper layer with respect to the semi-conductor layer, requires only two masks for its production, and hence has a low manufacturing cost. FIG.1 shows the top view of the pixel section of the conventional TFT substrate, and FIG. 2 the cross-sectional view of FIG. 1 taken along the line 1X–1X'. On a transparent TFT substrate (10) such as of glass, the liquid crystal driving pixel electrodes (11P) are arrayed. Between the pixel electrodes (11P) the drain lines (11L) acting as signal electrode lines are disposed. In the direction of crossing the drain lines (11L), the gate lines (15L) acting as the scanning electrode line are disposed. In the lower layer of the gate line (15L) a semi-conductor layer (13) and an insulation layer (14) are formed in the same pattern as the gate line (15L). Also gate electrodes (15G) extend from the gate line (15L) which runs across the drain lines (11L). A TFT is formed in this region under the gate electrode (cf. the region within the dot-dashed line in FIG.1). The TFT is formed by some layers, namely, a source electrode (11S) which is a part of the pixel electrode (11P), a drain electrode (11D) which is in one with the drain lines (11L), the semi-conductor layer (13) which is formed over the source electrode (11S) and the drain electrode (11D), the insulation layer (14) which is formed on the semi-conductor layer (13), and the gate electrode (15G) which is formed on the insulation layer. Moreover, over the source electrode (11S) and the drain electrode (11D), a low resistance semi-conductor layer (12) is formed to obtain an ohmic contact between the source electrode (11S), the drain electrode (11D), and the semi-conductor layer (13).

A TFT having such a structure is produced by the following processes: first by forming ITO (Indium Tin Oxide) which is doped with phosphorus and, then by forming the first patterning layer of the source and drain electrodes (11S, 11D), the pixel electrode (11P) and the drain line (11L) using a first photoetching process. Next, for example by stacking a-Si, $SiN_x$ and Al one on top of the other, the second patterning layer of the gate line (15L) and the gate electrode (15G) is formed as well as the semi-conductor layer (13) and the insulation layer (14) disposed on the lower layer of the gate line (15L) and the gate electrode (15G), using a second photoetching process.

As described here, because the stagger type TFT can be manufactured by two photoetching steps, its manufacturing cost is low. However, on the other hand, it has the following problems. That is, because the semi-conductor layers (12, 13) and the gate insulator layer (14) are etched in the same pattern as the gate (i.e., the gate line and the gate electrode) (15), the structure becomes such that all the source electrodes (11S) and the drain electrodes (11D) along the gate electrode (15G) and the gate line (15L) are covered by the semi-conductor layer (13). This causes the formation of a parasitic channel between the source and drain electrodes (11S, 11D) along the gate line (15L). This is formed not only in the TFT channel but also between the neighboring pixels across the drain line (11L), forming a parasitic TFT as shown by the double dot-dashed line in FIG. 1. Such a phenomenon, which makes the signals interfere and jam between the pixels in which the parasitic TFT is formed, has become the cause of so-called cross talk, degrading the quality of the picture in the display.

SUMMARY OF THE INVENTION

It is the object of the invention to provide a liquid crystal display apparatus having a structure which prevents the formation of the parasitic transistor between neighboring pixels across the drain line.

To realize the above object, an active matrix type liquid crystal display apparatus of the present invention comprises the following features.

First, the active matrix type liquid crystal display apparatus of the present invention comprises a plurality of pixel electrodes formed on a substrate in a matrix array, and drain lines formed between the columns of said pixel electrodes, gate lines formed between the rows of said pixel electrodes, insulation layers and semi-conductor layers, formed under said gate lines, and thin film transistors formed in the vicinity of each intersection of said drain lines and said gate lines. Each of the thin film transistors comprises a source electrode section constituting a part of the pixel electrode, and a drain electrode section constituting a part of the drain line. Each transistor further comprises a channel layer constituting a part of the semi-conductor layers, a gate insulation layer formed on the channel layer and constituting a part of the insulation layers, and a gate electrode section formed on the gate insulation layer, constituting a part of the gate line and formed by extending the gate line. Further, the drain line comprises a projection part and the projection part is disposed in the vicinity of the joint of the gate electrode section.

Moreover, this projection part is formed within the region covered by the gate electrode or the gate line. Also, the projection part is, for example extended along the longitudinal direction of the gate line and from the drain line. Further, the gate line or the gate electrode is formed over the confronting region where the source electrode, and the drain electrode, as well as the projection part, are disposed facing each other, and in this confronting region, a channel region of the thin film transistor is formed.

The above mentioned projection part functions essentially as the drain electrode. Thus, by providing the projection part near the joint of the gate electrode, the drain electrode will be provided over almost all of the position confronting the source electrode of the thin film transistor. Because of this, the channel region formed in the confronting region of the source electrode section and the drain electrode becomes a closed and isolated shape inside a thin film transistor. The formation of the parasitic channel between the source electrode of one pixel and the drain electrode of another pixel, where the two pixels are neighboring across the drain line, is prevented. Even if the parasitic channel is formed, because the channel length of the regular thin film transistor is sufficiently shorter than that of this parasitic channel, and the carrier moving path in the parasitic channel is mostly cut off by the above mentioned projection part, the charge is absorbed by the regular channel. This causes the regular thin film transistor channel to conduct an electric flow with priority and the parasitic channel will be electrically disconnected.

As described here, owing to the composition of the present invention, the parasitic channel formed between the pixels neighboring each other across the drain line can be cut off. Hence the charge of a pixel electrode is prevented from leaking along the gate line to the drain line of another pixel across the drain line, and cross talk and interference of the signals can be prevented. Therefore it becomes possible to upgrade the display quality of the liquid crystal display apparatus.

Further, because the channel region is also formed in the confronting region of the projection part and the source electrode, compared to the channel formed in a straight, as in the prior art, a thin film transistor with essentially an equal channel width can be formed in a smaller area. This makes it possible to upgrade the aperture ratio of the liquid crystal display apparatus by decreasing the amount of the extension of the gate electrode which is formed by extending it from the gate line, in the direction of the pixel electrode.

Moreover, the projection part is characterized by being formed within the region covered by the gate line or the gate electrode. Therefore, in the case, for example, where aluminum is used as the gate electrode and the gate line material, even if a hillock occurs in this aluminum, the tip of the hillock is prevented from reaching the above mentioned projection part. Hence, by providing the projection part, a short circuit can be prevented from occurring between the gate and the drain line (including the drain electrode).

Further, the semi-conductor layer and the channel layer, the insulation layer and the gate insulation layer, the gate line and the gate electrode section are characterized by being formed in the same shape. Because these layers and lines can be patterned using the same mask, it becomes possible to decrease the number of manufacturing processes and the number of masks used in the liquid crystal display apparatus. In a liquid crystal display apparatus having this kind of structure, by providing the projection part in the drain line, the parasitic channel which is likely to occur along the gate line is definitely cut off in the above mentioned composition.

Furthermore, another active matrix type liquid crystal display apparatus of the present invention comprises a plurality of pixel electrodes formed on a substrate in a matrix array, drain lines formed between the columns of the pixel electrodes, and gate lines formed between the rows of the pixel electrodes. A thin film transistor is formed in the vicinity of each intersection of the drain lines and the gate lines. Each thin film transistor comprises a source electrode section constituting a part of the pixel electrode, and formed by extending from the pixel electrode in the direction of the gate line, a drain electrode section constituting a part of the drain line, a channel layer constituting a part of the semiconductor layer, the channel layer being formed so as to cross over the source electrode section and the drain electrode section, a gate insulation layer formed on the channel layer and constituting a part of the insulation layer, and a gate electrode section formed on the gate insulation layer and constituting a part of the gate line. Further, the drain line comprises a projection part in the vicinity of the intersection of the drain line and the gate line, the projection part being formed within the forming region of the gate electrode section, surrounding the source electrode section.

Moreover, describing the structure more concretely, the source electrode is surrounded on three sides by the projection part and the drain electrode. The projection part is, for example, built in an 'L'-shape.

As described above, in the case where the source electrode extends from the pixel electrode, by disposing the drain electrode and the projection part so that they surround the source electrode, the formation of the parasitic channel between the neighboring pixels across the drain line, and the conducting of the channel, is reliably prevented. Further, since the projection part is formed inside the forming region of the gate electrode section, for example, even if the gate line and the gate electrode are made of aluminum, which tends to generate hillocks, a short circuit between the projection part and the gate electrode, caused by the hillock, is prevented.

Moreover, the gate electrode section is formed on the same line as the gate line, and possesses a wider width than the line width of the gate line, and further, it is composed so that the confronting region of the source electrode, and the drain electrode, as well as the projection part, are covered by the gate electrode section. Therefore, the channel region of the thin film transistor will be formed in the above mentioned confronting region, making it possible to efficiently form the thin film transistor having the same function (the same channel width) in a smaller area. Because of this, the area of the gate electrode can be made small, making it possible to upgrade the aperture ratio of the liquid crystal display apparatus.

Another embodiment of the present invention is related to a semi-conductor apparatus with a thin film transistor, the apparatus comprising a drain line, a gate line with an insulation layer and a semi-conductor layer formed below the insulation layer, and a thin film transistor formed in the vicinity of the intersection of the drain line and the gate line. The thin film transistor comprises a source electrode, a drain electrode electrically connected with the drain line, a channel layer formed to cross over the source electrode and the drain electrode, and constituting a part of the semiconductor layer, a gate insulation layer formed on the channel layer and constituting a part of the insulation layer, and a gate electrode formed on the gate insulation layer and constituting a part of the gate line. Further, the semiconductor layer and the channel layer, the insulation layer and the gate insulation layer, and the gate line and the gate electrode, are patterned in almost the same shape. A projection part is formed in the drain line in the vicinity of the intersection of the drain line and the gate line, the confronting region of the source electrode, the projection part and the drain electrode is covered by the gate electrode, and the thin film transistor is formed in the confronting region.

Further, the drain electrode and the projection part are formed to surround the source electrode.

Moreover, the gate line and the gate electrode are made of aluminum.

As described above, by adopting the above mentioned composition, the formation of the parasitic channel between the thin film transistors neighboring each other across the drain line, and its connection can be prevented. Therefore, the signal given by each thin film transistor can be reliably prevented from leaking to the drain line connected to the other thin film transistors.

BRIEF DESCRIPTION OF THE DRAWINGS

Other features and advantages of the invention will become clear from the following description of particular embodiments, in conjunction with the drawings, in which.

DESCRIPTION OF PREFERRED EMBODIMENTS (Embodiment 1)

The invention will be described with reference to a first embodiment shown in the Figures.

Figure 1:
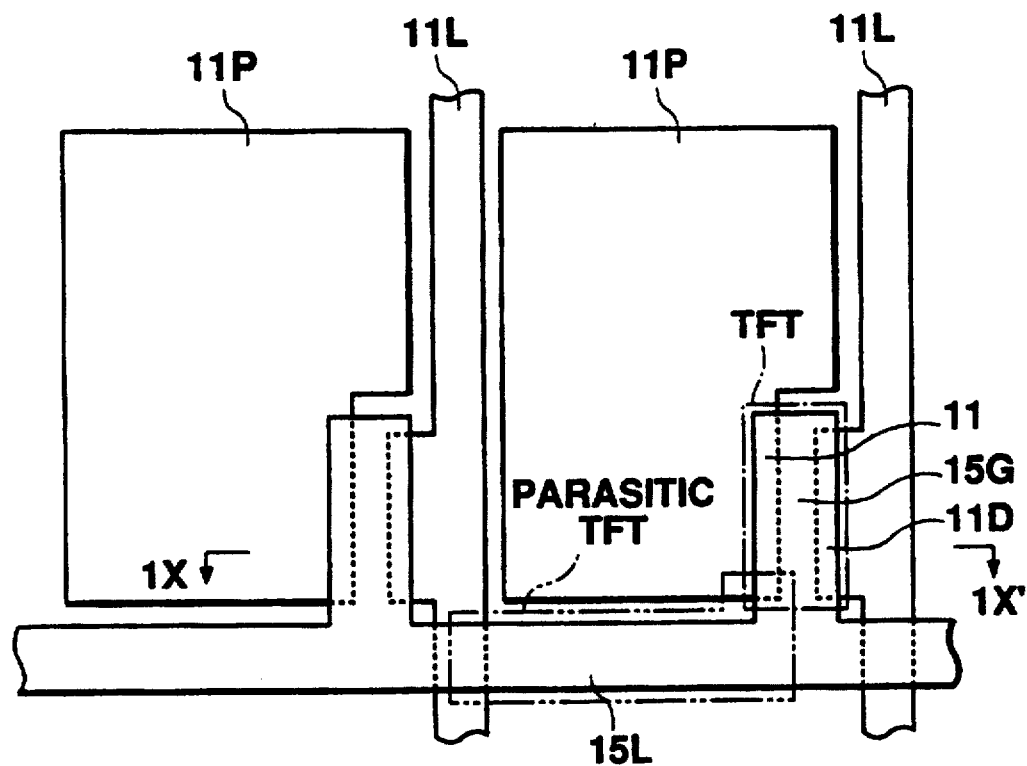
FIG. 1 is a plan view of an active matrix type liquid crystal display apparatus of the prior art.
Figure 2:
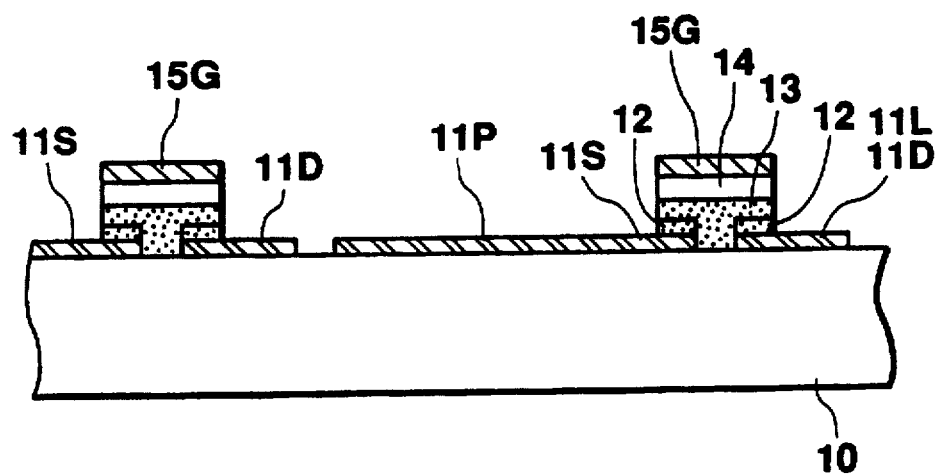
FIG. 2 is a cross-sectional view of FIG. 1 taken along line 1X—1X'.
Figure 3:
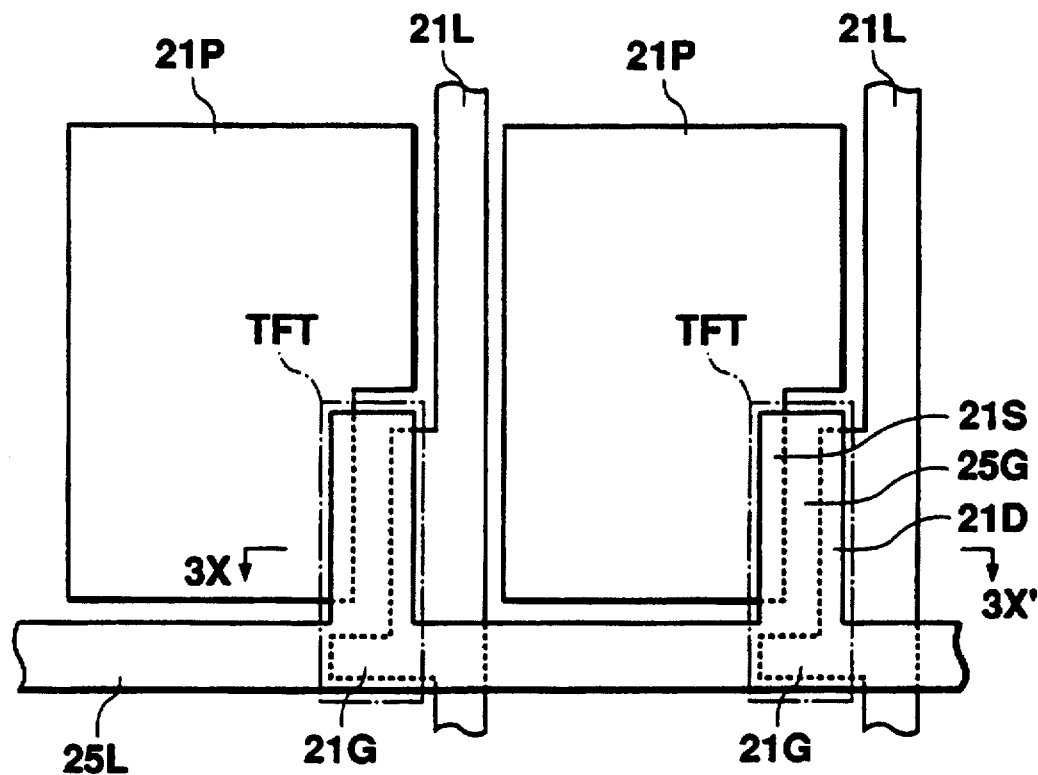
FIG. 3 is a plan view of an active matrix type liquid crystal display apparatus related to the first embodiment of the invention.
Figure 4:
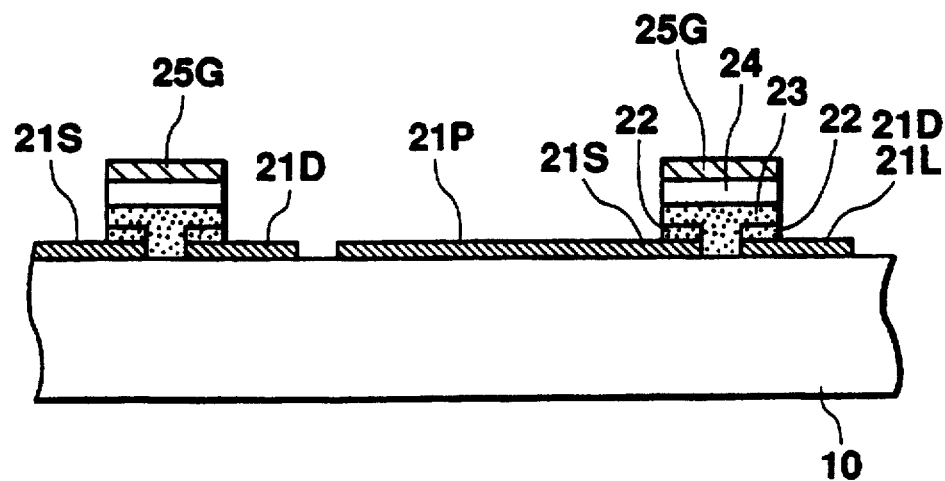
FIG. 4 is a cross-sectional view of FIG. 3 taken along line 3X—3X'.

FIG. 3 is a plan view of a liquid crystal display apparatus using the TFT related to the first embodiment of the present invention, and FIG. 4 is a cross sectional view taken along line 3X—3X'. On a transparent substrate (10) such as glass, pixel electrodes (21P) made from ITO are arranged in a matrix array, and drain lines (21L) similarly made from ITO are formed between the pixel electrodes (21P). A part of the pixel electrode (21P) becomes a source electrode (21S), a part of the drain line (21L) becomes a drain electrode (21D), and the two electrodes (21S, 21D) are disposed close together. Moreover, a part of the drain line (21L) projects in the direction of the gate line and this projection part becomes a guard electrode (21G).

On the other hand, in the direction crossing the drain line (21L), a gate line (25L) is formed consisting of Al and composed with a semi-conductor layer (23) of a-Si and an insulation layer (24) of $SiN_x$ in the lower layers. The gate line (25L) with such a structure has a part acting as a gate electrode (25G) section disposed in the region where the source electrode (21S) and the drain electrode (21D) are in close proximity to each other, and a TFT is formed in this region (cf. dot-dashed line of FIG. 3.) The guard electrode (21G) is disposed at the position confronting the joint of the gate electrode (25G). Therefore, the drain electrode (21D) and the guard electrode (21G) are provided over almost the whole one confronting the source electrode (21S), and the channel between the source and drain has the isolated structure inside the TFT region. Moreover, on the source electrode (21S), the drain electrode (21D) and the guard electrode (21G), a semi-conductor, which contains a high concentration of impurity, lies to act as a contact layer.

By having such a structure, the carrier moving path with the source electrode as one end, has the other end in the drain electrode (21D) and the guard electrode (21G) which confront this source electrode (21S). Therefore, hardly any of the carrier moving path will reach the drain line of the neighboring pixel by leaking out from the gate electrode (25G) section along the gate line (25L).

The guard electrode (21G) is formed at the same time as the drain line (21D) is formed, and is formed within the region covered by the gate line (25L). The guard electrode (21G) is disposed in a position separated from the line of the joint section of the gate electrode (25G), that is, at a position more central in the gate line (25L) than the joint section. By such an arrangement, the parasitic channel between the source and drain across the neighboring pixels is mostly cut off, and the source electrode (21S) voltage will not be affected by the signal voltage of the drain line (21L) of the neighboring pixel, and there will be no more cross talk or interference.

Here, to completely cut off the parasitic channel at the joint section of the gate electrode (25G), ideally, the guard electrode (21G) may be formed sticking out slightly from the region where the gate electrode (25G) and the gate line (25L) are formed, or the structure may be such that the guard electrode (21G) is completely covered by the gate line (25L). However, in the case where the guard electrode (21G) is out of the forming region of the gate line (25L), the side wall of the edge section of the gate line and the electrode (21L, 21G), will be disposed above the guard electrode with the semi-conductor layer (13) and the insulation layer (14) interposed therebetween. Therefore, in this section, there is a possibility of a short circuit between the gate and drain if the hillock (lateral hillock) is generated laterally from the side wall of the gate line and electrode (25L, 25G) and reaches the surface of the guard electrode (21G). Therefore, to prevent the problem of a short circuit caused by the hillock, the guard electrode (21G), as shown in FIG. 3, should preferably be disposed inside the region where the gate line (25L) is formed.

Incidentally, the parasitic channel in the source-drain of the neighboring pixels has a channel length longer than that of the TFT and has high resistance, and thus does not always have conductivity. However, the display data held by each pixel is affected, at least, from the neighboring pixels, and the display quality of the liquid crystal display is lowered. To counteract this, in the present embodiment, the parasitic channel is completely insulated, so that cross-talk and interference are eradicated, and by having the guard electrode (21G) disposed within the gate line and the electrode (25L, 25G) region, the parasitic channel is practically, and sufficiently cut off. Furthermore, a short circuit in the source and drain caused by the lateral hillock which occurs on the gate line and the electrode (25L, 25G) can be prevented.

Moreover, because the guard electrode (21G) is a part of the drain electrode (21D) and functions as the drain electrode, a part of the regular channel of the TFT is formed between the source electrode (21S) and the guard electrode (21G). Therefore, because the channel width can be increased up to the length of the guard electrode (21G) extended from the drain line (21L), the projection part length of the gate electrode (25G) from the gate line (25L) can be shortened, and the aperture ratio upgraded. Moreover, the drain line (21L) is connected to the driver section (not shown) where the voltage is stable, so cross talk and interference do not occur between the drain electrode (21D) of one pixel and the drain electrode (21D) of the neighboring pixel through the guard electrode (21G).

As is clearly described above, in the staggered type TFT manufactured by two masks, using providing the guard electrode (projection part), the parasitic channel between the source and the drain of the neighboring pixels is practically cut off. Therefore, cross talk and interference between the pixels are eradicated and the display quality is upgraded.
(Embodiment 2)

Next, an embodiment of the composition of a liquid crystal display apparatus having an electrode pattern other than that of embodiment 1 will be described.

Figure 5:
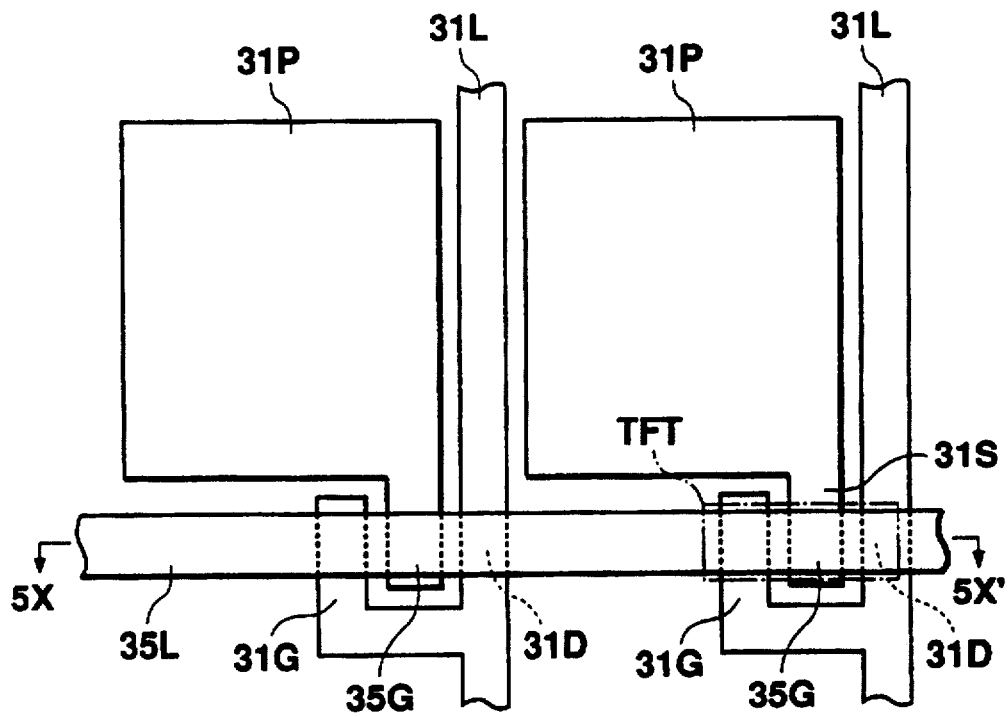
FIG. 5 is a plan view of an active matrix type liquid crystal display apparatus of the prior art, having a different composition from FIG. 1.
Figure 6:
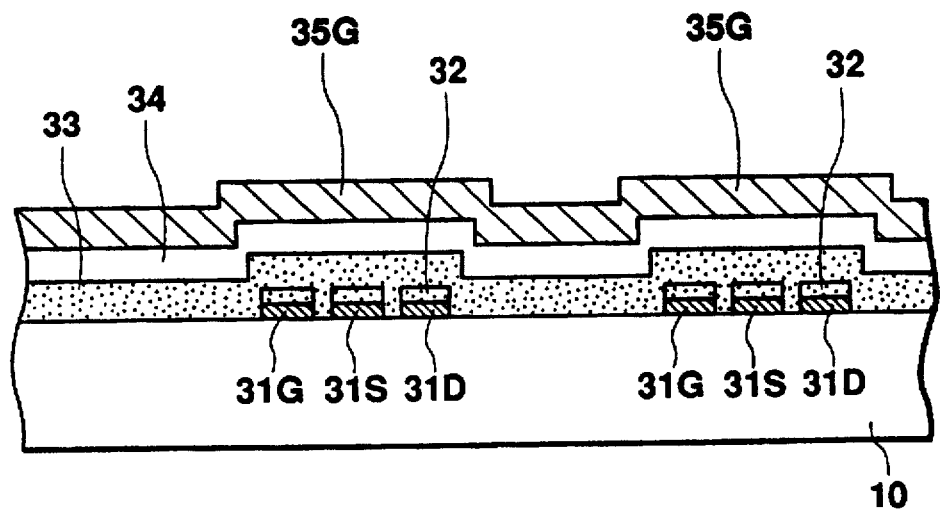
FIG. 6 is a cross-sectional view of FIG. 5 taken along line 5X—5X'.

FIG. 5 shows the electrode pattern of the liquid crystal display apparatus of the prior art related to the present embodiment, and FIG. 6 shows the cross section of FIG. 5 taken along line 5X—5X'.

In the drawings, the manufacturing process and the materials used for the apparatus are the same as those in embodiment 1. The difference from embodiment 1 is that the source electrode (31S) constituting a part of the pixel electrode (35P) is provided to extend toward the gate line (35L) acting as the gate electrode (35G). Moreover, the drain line (31L) is arranged to cross the gate line (35L), with an L-shaped (hook shaped) projection part, functioning as the guard electrode (31G), being a part of the drain line (31L) and extending from the drain line (31L). This projection part is disposed in the vicinity of the source electrode (31S), going around the periphery of the source electrode (31S), that is, surrounding the source electrode (31S), which is different from embodiment 1.

The gate line (35L) is built crossing over the guard electrode (31G), the source electrode (31S), and the drain line (31L). The thin film transistor, for charging the pixel electrode (31P) with a desired voltage, is formed in the region where the gate line (35L), crosses over the guard electrode (31G), the drain line (31L), and the source electrode (31S). Further, in the lower layers of the gate line (35L), an insulation layer (34) functioning as the gate insulation layer of the thin film transistor, and a semi-conductor layer (35) functioning as the channel of the thin film transistor, are formed.

Here, as described above, because the guard electrode (31G) is formed in a part of the drain line (31L), the channel of the thin film transistor is formed between the source electrode (31S) and the drain electrode (31D), and between the source electrode (31S) and the guard electrode (31G). Further, a low resistance semi-conductor layer (32) doped with highly concentrated impurities is formed on each of the source electrode (31S), the drain electrode (31D), and the guard electrode (31G) as shown in FIG.6. Owing to this semi-conductor layer (32), the semi-conductor layer (33) which becomes the channel, and the source electrode (31S), drain electrode (31D), and the guard electrode (31G) each of which is composed from ITO etc., are in ohmic contact.

As described above, because the guard electrode (31G) is formed to surround the source electrode (31S), the source-drain parasitic channel formed between the pixels neighboring each other across the drain line (31L) is cut off by the guard electrode (31G). This prevents the voltage shift in the source electrode (31S), and prevents cross talk and interference between the above mentioned neighboring pixels.

However, in the above mentioned composition, because the guard electrode (31G) surrounding the source electrode (31S) is also provided outside of the gate line forming region, there is a possibility that a short circuit may occur between the gate and the source and drain due to hillocks occurring in the gate line.

This means that the semi-conductor layer (33), the insulation layer (34), and the gate line (35L) are patterned in the same shape in the above mentioned composition. Therefore, in the intersection of the gate line (35L) and the guard electrode (31G), the distance between the side wall of the gate line and the surface of the guard electrode located below it, is equal to, just the distance of the film thickness of the semi-conductor layer (33) and the insulation layer (34).

On the other hand, at present, although low resistance Al is adopted as the material for the gate line (35L), this Al has a low heat resistance and has a tendency to generate what is called a hillock, a rod shaped projection part formed during the process of producing the thin film transistor etc.. The generated hillocks increase further in size while undergoing a high temperature process, sometimes becoming even up to several μm. Therefore, in the case where hillocks (lateral hillocks) are generated in the side wall section of the gate line (35L), the insulation between the gate line (35L) and the guard electrode (31G) becomes difficult to maintain with only the layer thickness (0.5–1 μm) of the insulation layer (34) and the semi-conductor layer (33), and the tips of the hillocks will reach the surface of the guard electrode (31G). Also, in the gate line (35L), at the intersection of source electrode (31S), and the drain electrode (31D), the distance between the side wall of the gate line (35L) and each electrode (31S, 31D) may be only as little as the layer thickness of the above mentioned semi-conductor layer (33) and the insulation layer (34), causing a problem in maintaining good insulation.

Particularly, in the liquid crystal display apparatus, on the surface of the substrate, polyimide is provided as the orientation control film to control the orientation of the liquid crystal. Since this polyimide is formed at a temperature of around 200° C., it promotes the growth of the hillocks, and is likely to generate a short circuit owing to the hillocks between the gate-source and the gate-drain (including the guard electrode).

Moreover, at the time of joining the substrate, on which TFTs are formed, together with the substrate on which a common electrode is formed, the fillers are sprayed between the two substrates, and if the fillers are located above the point at which the lateral hillocks are generated, a short circuit will occur because the lateral hillocks are physically pushed down towards the source electrode and the drain electrode (including the guard electrode) below.

Because of this, the present embodiment 2 is composed so that not only is the parasitic channel cut off, but also the occurrence of a short circuit caused by the above mentioned hillocks can be prevented. This composition will now be described with reference to FIG. 7 and FIG. 8. Further, for the section corresponding to the drawings already described, the same labels will be used and further description will be omitted.

Figure 7:
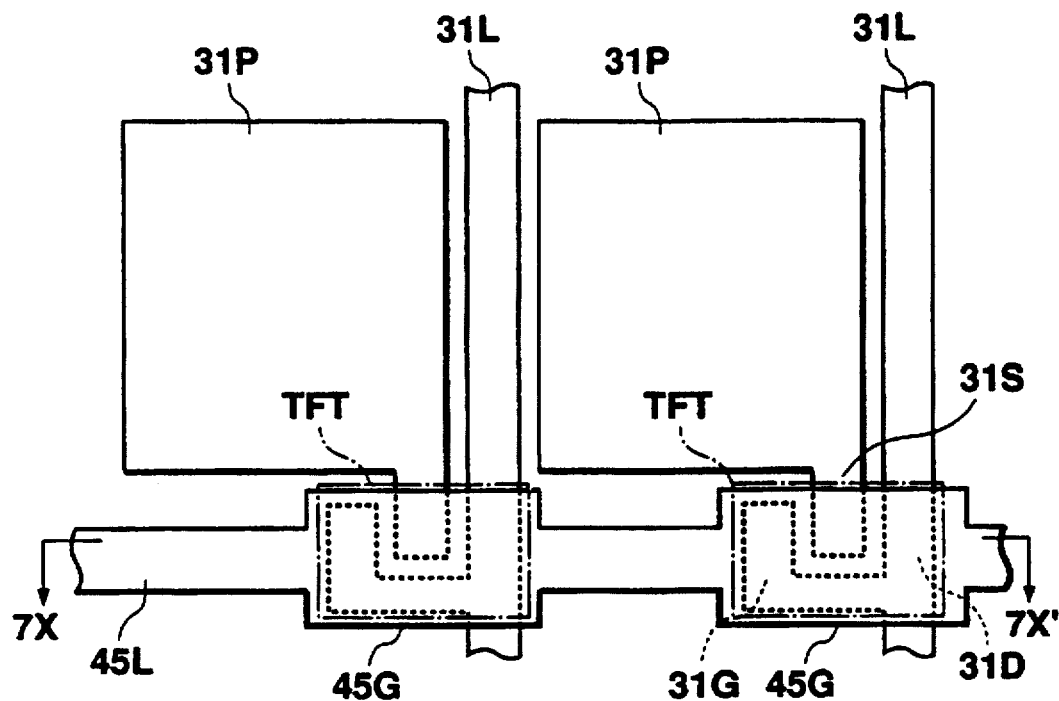
FIG. 7 is a plan view of an active matrix type liquid crystal display apparatus related to the second embodiment of the invention.
Figure 8:
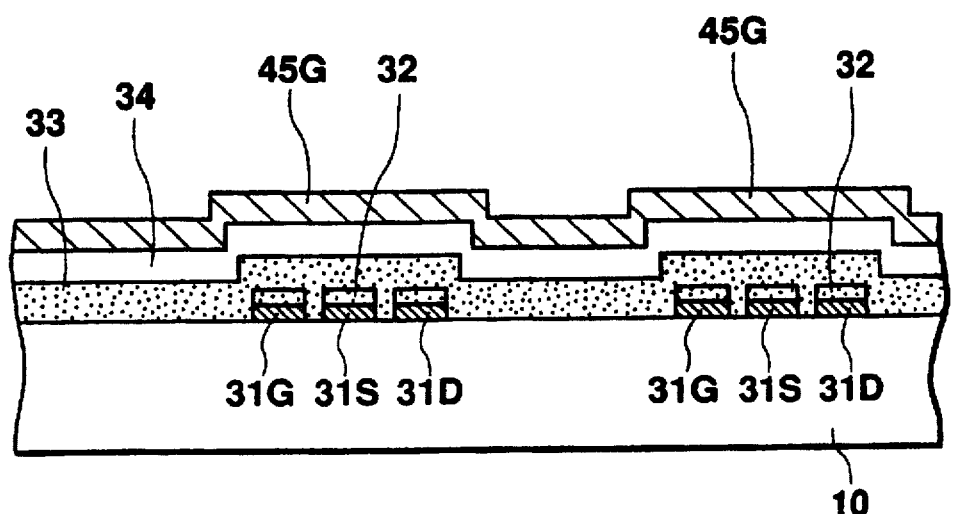
FIG. 8 is a cross-sectional view of FIG. 7 taken along line 7X—7X'.

FIG. 7 is a plan view of the pixel section of an active matrix type liquid crystal display apparatus related to the embodiment 2 of the present invention. FIG. 8 is a cross-sectional view of FIG. 7 taken along line 7X—7X'. Pixel electrodes (31P) and drain lines (31L) are made of ITO, and are formed on a transparent substrate (10) such as glass. The pixel electrode (31P) has a part projected to become a source electrode (31S). In the drain line (31L), an L-shaped projection part is provided from a drain electrode (31D) section which is disposed in the vicinity of the source electrode (31S), and this projection part is extended to the opposite side of the drain electrode (31D) with the source electrode (31S) sandwiched therebetween, to constitute a guard electrode (31G). In the direction intersecting with the source electrode (31S), the drain electrode (31D), and the guard electrode (31G), a gate line (45L) is formed, and a semiconductor layer (33) of a-Si and an insulation layer (34) of $SiN_x$ are formed under the gate line (45L) in the same pattern as the gate line (45L). Moreover, on the source electrode (31S), the drain electrode (31D), and the guard electrode (31G), an a-Si layer (32) doped to a high concentration into the N-type, and acting as a contact layer, is formed and forms an ohmic contact between the a-Si layer (33) which forms the channel and the source and drain electrodes (31S, 31D).

The gate electrode (45G) is formed having a line width wider than that of the other gate line (45L) so that it covers the forming region of the source electrode (31S), the drain electrode (31D), and the guard electrode (31G). Moreover, because the gate electrode (45G) is integrally composed with the gate line (45L), in a similar manner to the other parts of the gate line (45L), in its lower layer, the semiconductor layer (33) of a-Si, and the insulation layer (34) of $SiN_x$ are formed in that order from the bottom, and as is clear from FIG. 7, these layers are patterned in the same shape as that of the gate electrode (45G). The TFT is formed in the region covered by the gate electrode (45G) (cf. dot-dashed line in FIG. 7).

By forming each of the lines and electrodes with the pattern such as mentioned above, there are three regions per pixel in which the side walls of the gate line [including the gate electrode (45G)] (45L) sandwich the insulation layer (34) and the semi-conductor layer (33), and are disposed above the other conductive layers. That is, at the intersection of the drain line (31L) and the gate line (45L), there are two of the above mentioned regions with the width corresponding to that of the drain line (31L). In the position where the gate electrode (45G) is disposed above the source electrode (31S), there is one above-mentioned region having the source electrode (31S) width. The total number of regions is suppressed to three. On the other hand, in the composition shown in FIG. 5, the total number of the previously-mentioned regions is six.

As described here, by minimizing the sections where the walls of the gate line and the electrode (45L, 45G), are located above the source and the drain electrodes and the lines (31S, 31D, 31L), even if lateral hillocks appear in the side wall of the gate Al layer and reach the lower layer, the probability that they will cause a short circuit with the source and the drain electrodes and the drain line decreases significantly.

Moreover, because the channel region is formed in a U-shape, and is confined within the formation region of the gate electrode (45G), the channel width can be sufficiently widened. Because of this, even if the gate electrode (45G) is formed into the region covering the entire area of the source, drain and guard electrodes, there is no need to enlarge the gate electrode (45G) more than the previous size, and hence since the TFT is not enlarged, the aperture ratio is not lowered.

Further, even with this structure, by providing the guard electrode (31G), the source electrode (31S) is protected from the effect of the drain electrode (31D) which supplies signals to the adjacent pixels across the drain line (31L), so that cross talk and interference are prevented.

As is clear from the above description, by providing the guard electrode integrally formed with the drain electrode and disposed to surround the source electrode, cross talk and interference between the pixels on the same gate line can be prevented, and a short circuit between the gate-source and between the gate-drain caused by hillocks generated in the side wall of the gate electrode line Al layer is prevented, and the defective ratio is improved.

Moreover, it is possible to produce a TFT having the above structure by simply changing the mask pattern, so there is no need to increase the number of masks, and hence the manufacturing cost is low.

Further, although in embodiments 1 and 2, the guard electrode is described as being rectangular or L-shaped, there is no need to limit it to these shapes. Also, these shapes can, according to the source electrode or the layout as a whole, take various polygonal shapes.

What is claimed is:

1. An active matrix type liquid crystal display apparatus comprising:

a plurality of pixel electrodes arranged on a substrate in a matrix array;

drain lines formed between columns of said pixel electrodes;

gate lines formed between rows of said pixel electrodes;

an insulation layer and a semi-conductor layer formed under each of said gate lines; and a thin film transistor formed in the vicinity of each intersection of said drain lines and said gate lines, wherein each of said thin film transistors includes:

a source electrode section constituting a part of one of said pixel electrodes;

a drain electrode section constituting a part of one of said drain lines;

a channel layer constituting a part of one of said semi-conductor layers and formed to cross over said source electrode section and said drain electrode section;

a gate insulation layer formed on said channel layer and constituting a part of one of said insulation layers; and a gate electrode section that is formed on said gate insulation layer and constitutes a part of one of said gate lines, said gate electrode section including an extending portion of said one gate line that is formed so as to extend from the main portion of said one gate line, wherein said one drain line includes a projection part, said projection part being disposed in the vicinity of where the extending portion extends from the main portion of said one gate line.

2. The liquid crystal display apparatus according to claim 1, wherein said projection part is formed within the region covered by said one gate line or said gate electrode section.

3. The liquid crystal display apparatus according to claim 2, wherein said projection part is extended from said one drain line along the longitudinal direction of said one gate line.

4. The liquid crystal display apparatus according to claim 2, wherein said one gate line or said gate electrode section is formed over the confronting region of said source electrode section, said drain electrode sections, and said projection part, and a channel region of said thin film transistor is formed in said confronting region.

5. The liquid crystal display apparatus according to claim 2, wherein said one gate line and said gate electrode section are made of aluminum.

6. The liquid crystal display apparatus according to claim 1, wherein said one semi-conductor layer and said channel layer, said one insulation layer and said gate insulation layer, and said one gate line and said gate electrode section are formed into the same shape.

7. An active matrix type liquid crystal display apparatus comprising:
- a plurality of pixel electrodes formed on a substrate in a matrix array;
- drain lines formed between the columns of said pixel electrodes;
- gate lines formed between the rows of said pixel electrodes;
- an insulation layer and a semi-conductor layer formed under each of said gate lines; and
- a thin film transistor formed in the vicinity of each intersection of said drain lines and said gate lines, wherein each of said thin film transistors includes;
- a source electrode section constituting a part of one of said pixel electrodes;
- a drain electrode section constituting a part of one of said drain lines;
- a channel layer constituting a part of one of said semi-conductor layers and formed to cross over said source electrode section and said drain electrode section;
- a gate insulation layer formed on said channel layer and constituting a part of one of said insulation layers; and
- a gate electrode section formed on said gate insulation layer and constituting a part of one of said gate lines, wherein said source electrode section includes an extending portion of said pixel electrode that is formed so as to extend from the main portion of said pixel electrode towards said one gate line, said one drain line includes a projection part disposed in the vicinity of the intersection of said one drain line and said one gate line, said projection part being formed within the region covered by said gate electrode section and being formed so as to substantially surround said source electrode section, said one gate line is widened in the part constituting said gate electrode section, and the edges of said one gate line that do not extend in the direction of said one gate line are arranged outside the regions where said one drain line, said drain electrode section, and said projection part are formed, so that said edges do not overlap these regions.

8. The liquid crystal display apparatus according to claim 7, wherein said source electrode section is substantially surrounded in three directions by said projection part and said drain electrode section.

9. The liquid crystal display apparatus according to claim 7, wherein said projection part is formed in an L-shape.

10. The liquid crystal display apparatus according to claim 7,
wherein the confronting region of said source electrode section, said drain electrode section, and said projection part is covered by said gate electrode section, and
a channel region of the thin film transistor is formed in said confronting region.

11. The liquid crystal display apparatus according to claim 7, wherein said one gate line and said gate electrode section are made of aluminum.

12. A device including thin film transistors, said device comprising:

drain lines;
gate lines, each gate line having at least one insulation layer and at least one semi-conductor layer formed in the layers below; and
a thin film transistor formed in the vicinity of each intersection of said drain lines and said gate lines, wherein at least one of said thin film transistors includes:
- a source electrode;
- a drain electrode electrically connected with one of said drain lines;
- a channel layer formed to cross over said source electrode and said drain electrode, said channel layer constituting a part of one of said semi-conductor layers;
- a gate insulation layer formed on said channel layer and constituting a part of one of said insulation layers; and
- a gate electrode formed on said gate insulation layer and constituting a part of one of said gate lines, wherein said one semi-conductor layer and said channel layer, said one insulation layer and said gate insulation layer, and said one gate line and said gate electrode are patterned in substantially the same shape, a projection part is formed in said one drain line in the vicinity of the intersection of said one drain line and said one gate line, the confronting region of said source electrode, said drain electrode, and said projection part is covered by said gate electrode, a channel region of said thin film transistor is formed in said confronting region, and said gate electrode is formed from a widened portion of said one gate line, and the edges of said one gate line that do not extend in the direction of said one gate line are arranged outside the regions where said one drain line, said drain electrode, and said projection part are formed, so that said edges do not overlap these regions.

13. The device according to claim 12, wherein said drain electrode and said projection part are formed so as to substantially surround said source electrode.

14. The device according to claim 12, wherein said one gate line and said gate electrode are made of aluminum.

15. An active matrix type liquid crystal display apparatus comprising:
- a plurality of pixel electrodes formed on a substrate in a matrix array;
- drain lines formed between the columns of said pixel electrodes;
- gate lines formed between the rows of said pixel electrodes, each gate line covering at least one insulation layer and at least one semi-conductor layer; and
- a thin film transistor formed in the vicinity of each intersection of said drain lines and said gate lines, wherein at least one of said thin film transistors includes:
- a source electrode section constituting a part of one of said pixel electrodes;
- a drain electrode section constituting a part of one of said drain lines;
- a channel layer constituting a part of one of said semi-conductor layers and formed to cross over said source electrode section and said drain electrode section;
- a gate insulation layer formed on said channel layer and constituting a part of one of said insulation layers; and a gate electrode section formed on said gate insulation layer and constituting a part of one of said gate lines, wherein said source electrode section includes an extending portion of said pixel electrode that is formed so as to extend from the main portion of said pixel electrode towards said one gate line, said one gate line is widened in the part constituting said gate electrode section, said one drain line intersects said one gate line in the widened portion of said one gate line, and includes a projection part disposed in the vicinity of the intersection with said one gate line, said projection part being formed within the region covered by said gate electrode section and being formed so as to substantially surround said source electrode section, and said projection part and the entire width of said one drain line in the part constituting said drain electrode section are completely covered by said gate electrode section via said channel layer and said gate insulation layer, so that each edge of said projection part and the lengthwise-running edges of said one drain line do not lie outside the region covered by said widened portion of said one gate line.

16. The liquid crystal display apparatus according to claim 15, wherein said source electrode section is substantially surrounded in three directions by said projection part and said drain electrode section.

17. The liquid crystal display apparatus according to claim 15, wherein said projection part is formed in an L-shape.

18. The liquid crystal display apparatus according to claim 15, wherein the confronting region of said source electrode section, said drain electrode section, and said projection part is covered by said gate electrode section, and a channel region of the thin film transistor is formed in said confronting region.

19. The liquid crystal display apparatus according to claim 15, wherein said one gate line and said gate electrode section are made of aluminum.

* * * * *